(12) United States Patent
Park et al.

(10) Patent No.: US 7,033,944 B2
(45) Date of Patent: Apr. 25, 2006

(54) DUAL DAMASCENE PROCESS

(75) Inventors: Wan-Jae Park, Suwon (KR); Il-Goo Kim, Sungnam-shi (KR); Sang-Rok Hah, Seoul (KR); Kyoung-Woo Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 185 days.

(21) Appl. No.: 10/654,770

(22) Filed: Sep. 4, 2003

(65) Prior Publication Data

US 2004/0058538 A1 Mar. 25, 2004

(30) Foreign Application Priority Data

Sep. 19, 2002 (KR) .................. 10-2002-0057192

(51) Int. Cl.
*H01L 21/302* (2006.01)
(52) U.S. Cl. .................. 438/696; 438/700; 438/710; 438/718
(58) Field of Classification Search ................ 438/694, 438/696, 697, 700, 710, 718
See application file for complete search history.

(56) References Cited

U.S. PATENT DOCUMENTS

| | | |
|---|---|---|
| 4,427,083 A | 1/1984 | Muddle |
| 4,804,052 A | 2/1989 | Griffen |
| 5,724,267 A | 3/1998 | Richards |
| 5,734,128 A | 3/1998 | Gades et al. |
| 6,057,239 A * | 5/2000 | Wang et al. ............... 438/689 |
| 6,362,093 B1 * | 3/2002 | Jang et al. ................ 438/633 |
| 6,629,056 B1 | 9/2003 | Han et al. |
| 6,720,249 B1 * | 4/2004 | Dalton et al. ............. 438/624 |
| 6,753,250 B1 * | 6/2004 | Hill et al. ................. 438/637 |
| 6,858,153 B1 * | 2/2005 | Bjorkman et al. ........... 216/72 |

OTHER PUBLICATIONS

Larsen et al., "Reduction in Locomotor Activity of Arthritic Rats as Parameter for Chronic Pain: Effect of Morphine, Acetylsalicylic Acid and Citalopram," Acta Pharmacol. Et Toxicol., 57:345-351 (1985).

Cain et al., "Pain-Related Disability and Effects of Chronic Morphine in the Adjuvant-Induced Arthritis Model of Chronic Pain," Physiology & Behavior, 62(1):199-205 (1997).

(Continued)

*Primary Examiner*—Nadine G. Norton
*Assistant Examiner*—Binh X. Tran
(74) *Attorney, Agent, or Firm*—F.Chau & Associates, LLC

(57) ABSTRACT

A dual damascene process is disclosed. According to the dual damascene process of the present invention, a first recessed region through an intermetal dielectric layer is filled with a bottom protecting layer, and the bottom protecting layer and the intermetal dielectric layer are simultaneously etched to form a second recessed region that has a shallower depth and wider width than the first recessed region on the first recessed region by using an etch gas selectively etches the intermetal dielectric layer with respect to the bottom protecting layer. In other words, the etch selectivity ratio, the intermetal dielectric layer with respect to the bottom protecting layer, is preferably about 0.5 to about 1.5. Thus, it is possible to form a dual damascene structure without the formation of a byproduct or an oxide fence.

16 Claims, 5 Drawing Sheets

OTHER PUBLICATIONS

Hallas et al., "Establishment of Behavioral Parameters for the Evaluation of Osteopathic Treatment Principles in a Rat Model of Arthritis," JAOA, 97(4):207-214 (1997).

Sluka et al. "Differential Effects of N-Methyl-D-Aspartate (NMDA) and non-NMDA Receptor Antagonists on Spinal Release of Amino Acids After Development of Acute Arthritis in Rats," Brain Research, 664:77-84.

Lawand et al., "Nicotinic Cholinergic Receptors: Potential Targets for Inflammatory Pain Relief," Pain, 80-291-299, (1999).

Lu et al., "Gabapentin Attenuates Nociceptive Behaviors in a Acute Arthritis Model in Rats," The Journal of Pharmacology and Experimental Therapeutics, 290(1):214-219 (1999).

Okuda et al., "Arthritis Induced in Cat by Sodium Urate: A possible Animal Model For Tonic Pain," Pain, 18-287-297 (1984).

Clarke, K.A., "Differential Fore-and Hindpaw Force Transmission in the Walking Rat," Physiology & Behavior, 58(3): 415-419 (1995).

Clarke et al., "Gait Analysis in a Rat Model of Osteoarthrosis," Physiology & Behavior, 62(5):951-954 (1997).

Schott et al., "Weight Bearing as an Objective Measure of Arthritic Pain in the Rat," Journal of Pharmacological and Toxicological Methods, 31(2):79-83 (1994).

* cited by examiner

DUAL DAMASCENE PROCESS

TECHNICAL FIELD OF THE INVENTION

The present invention relates generally to a method of forming a semiconductor device, and more particularly, to forming a semiconductor device having a dual damascene structure to protect a bottom interconnection without forming an oxide fence.

BACKGROUND

Generally, tungsten, aluminum, or copper is used for a metal interconnection in a semiconductor device. Copper has a lower resistance and superior reliability than aluminum or tungsten. The research and development has focused on methods for using copper for metal interconnection as an alternative to aluminum.

However, it is difficult to perform a dry-etch process on copper than on tungsten or aluminum. Thus, dual damascene methods have been developed which enable simultaneous formation of a contact plug and an interconnection with copper, without performing a dry-etch process. In a dual damascene process, a contact hole and a groove are formed through an interlayer dielectric layer, and then the contact hole and the groove are filled with copper. Thus, a contact hole and an interconnection are simultaneously formed. A conventional method of forming a dual damascene structure will now be explained with reference to FIG. 1, which illustrates a cross-sectional view of a semiconductor device having a dual damascene structure formed according to a conventional method.

Referring to FIG. 1, a bottom layer 11 and an interlayer dielectric layer 12 are sequentially formed on a semiconductor substrate 10. The interlayer dielectric layer 12 is patterned to form a bottom-recessed region and the bottom-recessed region is filled with a conductive material to form a bottom interconnection 13. A first etch stopping layer 15, a bottom intermetal dielectric layer 17, a second etch stopping layer 19, and an upper intermetal dielectric layer 21 are sequentially stacked on an entire surface of a semiconductor substrate 10 having the bottom interconnection 13 and the interlayer dielectric layer 12. The first and second etch stopping layer 15 and 19 may be formed of a silicon nitride ($Si_3N_4$), and the upper and bottom intermetal dielectric layer 21 and 17 may be formed of an oxide material. By using a photoresist pattern, the upper intermetal dielectric layer 21, the second etch stopping layer 19, and the bottom intermetal dielectric layer 17 are sequentially patterned to form a first recessed region 22 exposing the first etch stopping layer 15. By using another photoresist pattern, the upper intermetal dielectric layer 21 is etched to form a second recessed region having a shallower depth and wider width than the first recessed region 22 and a portion of the second etch stopping layer 19 is exposed. A gas comprising fluorocarbon is used as an etch gas. Then, the exposed second etch stopping layer 19 is patterned to expose a portion of the bottom intermetal dielectric layer 17, and the first etch stopping layer 15 is simultaneously patterned to expose the bottom interconnection 13.

In a conventional etch process using a conventional etch gas, there is a little etch selectivity between the first etch stopping layer 15 and the upper intermetal dielectric layer 21. Thus, when the upper intermetal dielectric layer 21 is etched to form the second recessed region 23, the first etch stopping layer 15 is also etched. Furthermore, the bottom interconnection 13 is etched. At this time, the bottom interconnection 13 reacts with the etch gas to form a by product P.

FIGS. 2A through 2C are cross-sectional views showing a method of forming a dual damascene structure according to another conventional method.

Referring to FIG. 2A, to solve the problem discussed in view of FIG. 1, a bottom anti-refractive coating 25 is conformally formed to protect the bottom interconnection 13 and the first etch stopping layer 15 on an entire surface of a semiconductor substrate 10 where the first recessed region 22 is formed.

Referring to FIG. 2B, a photoresist pattern PR is formed on the bottom anti-refractive coating 25. The bottom anti-refractive coating 25 is anisotropically etched by using the photoresist pattern PR to expose the upper intermetal dielectric layer 21. By anisotropically etching the bottom anti-refractive coating 25, a first bottom anti-refractive coating pattern 25a remains under the photoresist pattern PR, and a second bottom anti-refractive coating pattern 25b remains covering a bottom and a portion of a sidewall of the first recessed region 22. A top portion of the second bottom anti-refractive coating pattern 25b can be higher than the second etch stopping layer 19, as shown in FIG. 2B.

Referring to FIG. 2C, by using the photoresist pattern PR, the upper intermetal dielectric layer 21 is anisotropically etched to form a second recessed region 23 having a shallower depth and a wider width than the first recessed region 22 and exposing the second etch stopping layer 19. When the upper intermetal dielectric layer 21 is anisotropically etched in order to form the second recessed region 23, an oxide fence 21a is formed on the second etch stopping layer 19 due to the second bottom anti-refractive coating pattern 25b. The oxide fence 21a creates problems in subsequent processing. For example, in a case of forming a barrier metal layer in a subsequent process, it is difficult to form a barrier metal layer along a profile of the second recess region 23 due to the oxide fence 21a. Thus, a method of forming a dual damascene structure is needed to protect the bottom interconnection 13 without forming the oxide fence 21a.

SUMMARY OF THE INVENTION

The present invention is directed to methods of forming a dual damascene structure that protects a bottom interconnection without forming an oxide fence.

According to an embodiment of the present invention, a dual damascene process comprises forming a first etch stopping layer, a bottom intermetal dielectric layer, a second etch stopping layer, and an upper intermetal dielectric layer, sequentially, on an entire surface of a semiconductor substrate having a bottom interconnection. The upper intermetal dielectric layer, the second etch stopping layer, and the bottom intermetal dielectric layer are successively patterned by using a first etch recipe to form a first recessed region exposing a predetermined region of the first etch stopping layer. A bottom-protecting layer having a planarized surface is formed on the upper intermetal dielectric layer and in the first recessed region. The bottom protecting layer and the upper intermetal dielectric layer are successively patterned by using a second etch recipe to form a second recessed region being overlapped with the first recessed region and having a wider width than the first recessed region. The second etch recipe uses an etching gas that selectively etches the upper intermetal dielectric layer with respect to the bottom-protecting layer. In other words, the etching gas has a selectivity ratio, the upper intermetal dielectric layer with respect to the bottom-protecting layer, of about 0.5 to about 1.5. Then, the bottom protecting layer is selectively removed to expose a predetermined region of the first etch stopping layer. Next, a portion of the first etch stopping layer in the first recessed region is removed to expose the bottom interconnection.

According to another embodiment of the present invention, the upper and bottom intermetal dielectric layers may be formed of silicon oxycarbide (SiOC:H). Preferably, the bottom-protecting layer is formed of hydrogen silsesquioxane (HSQ).

According to another embodiment of the present invention, the second etch recipe may employ a mixed gas of a high-ratio fluorocarbon ($C_V F_W$) and a low-ratio fluorocarbon ($C_X F_Y$). Preferably, V/W is about 0.5 or greater in the chemical formula $C_V F_W$ of the high-ratio fluorocarbon. Preferably, the high-ratio fluorocarbon is selected from a group consisting of $C_4F_6$, $C_5F_8$, and $C_4F_8$. In addition, X/Y is about 0.4 or lower in the chemical formula $C_X F_Y$ of the low-ratio fluorocarbon. Preferably, the low-ratio fluorocarbon is selected from a group consisting of $CF_4$ and $C_2F_6$. A flow rate ratio of the high-ratio fluorocarbon with respect to the low-ratio fluorocarbon is preferably about 0.5 to about 1.5.

According to another embodiment of the present invention, the second etch recipe may employ a mixed gas of a high-ratio fluorocarbon ($C_V F_W$) and a fluorohydrocarbon ($CH_T F_U$) as an etch gas. Preferably, V/W is about 0.5 or greater in the chemical formula $C_V F_W$ of the high-ratio fluorocarbon. Preferably, the high-ratio fluorocarbon is selected from a group consisting of $C_4F_6$, $C_5F_8$, and $C_4F_8$. The fluorohydrocarbon is preferably selected from a group consisting of $CH_3F$, $CH_2F_2$, and $CHF_3$. A flow rate ratio of the fluorohydrocarbon with respect to the high-ratio fluorocarbon is preferably about 0.5 to about 1.5.

These and other embodiments, features, aspects, and advantages of the present invention will be described and become apparent from the following detailed description of the preferred embodiments when read in conjunction with the accompanying drawings.

DETAILED DESCRIPTION OF PREFERRED EMBODIMENTS

Figure 1:
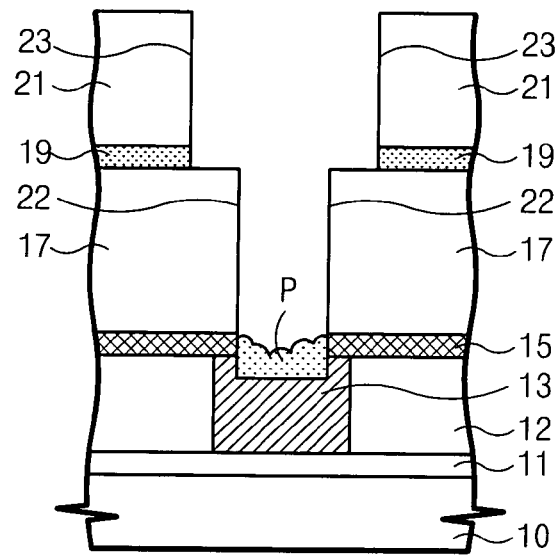
FIG. 1 illustrates a cross-sectional view of a semiconductor device having a dual damascene structure formed according to a conventional method.
Figure 2A:
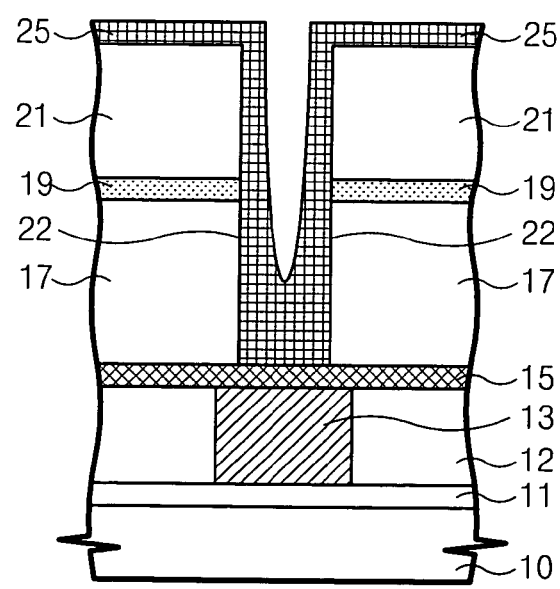
FIGS. 2A through 2C are cross-sectional views illustrating a method of forming a dual damascene structure according to another conventional method.
Figure 2B:
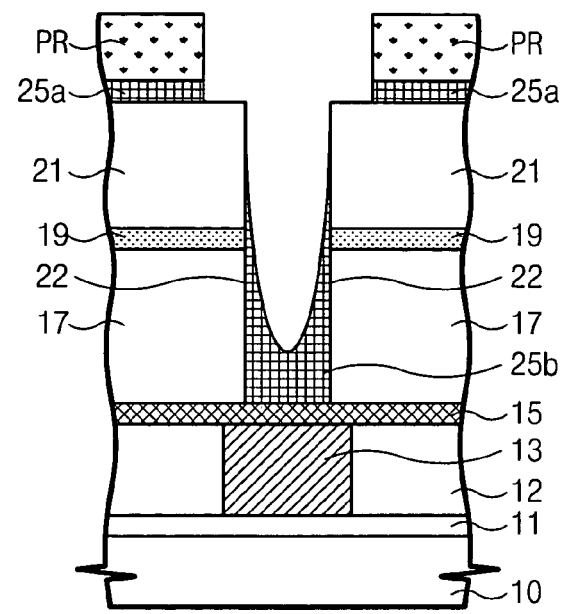
Figure 2C:
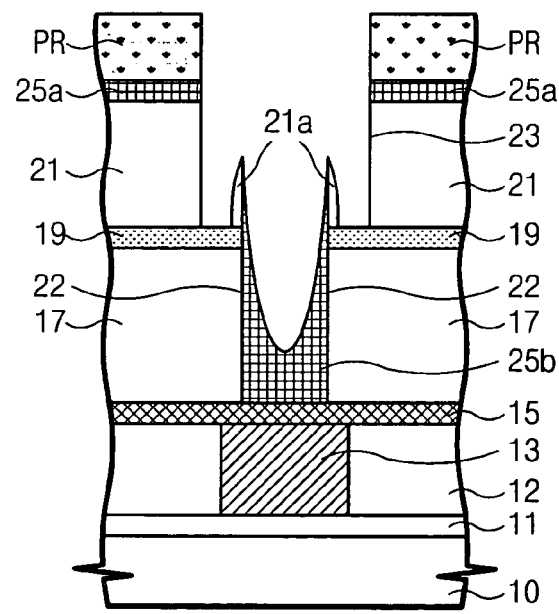

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the element or intervening elements may also be present.

Furthermore, relative terms, such as "beneath", may be used herein to describe the relationship of one element to another element as illustrated in the Figures. It will be understood that relative terms are intended to encompass different orientations of the device in addition to the orientation depicted in the Figures. For example, if the device in the Figures is turned over, elements described as "below" other elements would then be oriented "above" the other elements. The exemplary term "below", can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer, or section discussed below could be termed a second region, layer or section, and similarly, a second region discussed below could be termed a first region without departing from the teachings of the present invention. Like numbers refer to like elements throughout.

FIGS. 3A through 3F illustrate cross-sectional views showing a method of forming a dual damascene structure according to a preferred embodiment of the present invention.

Figure 3A:
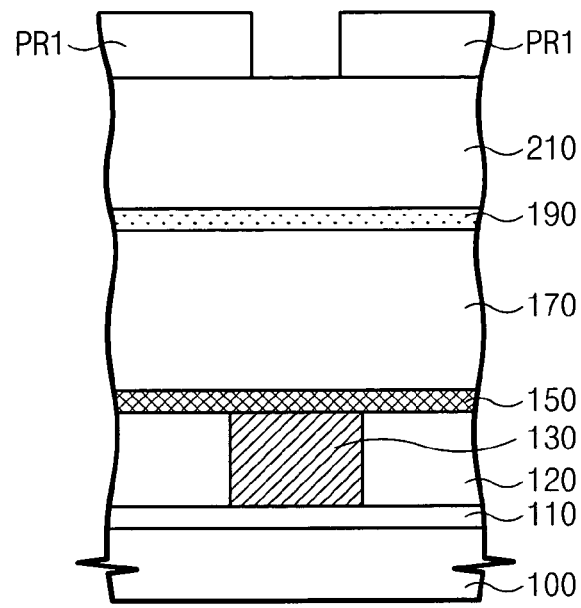
FIGS. 3A through 3F illustrate cross-sectional views showing a method of forming a dual damascene process according to an embodiment of the present invention.

Referring to FIG. 3A, a bottom layer 110 and an interlayer dielectric layer 120 are sequentially stacked on a semiconductor substrate 100. Preferably, the bottom layer 110 and the interlayer dielectric layer 120 are a silicon oxide. The interlayer dielectric layer 120 is patterned to form a trench. A conductive layer is formed on an entire surface of the semiconductor substrate 100 to fill the trench. The conductive layer can be copper, aluminum, or tungsten. A CMP process is performed with respect to the conductive layer to form a bottom interconnection 130 in the trench and to expose the interlayer dielectric layer 120. A first etch stopping layer 150, a bottom intermetal dielectric layer 170, a second etch stopping layer 190 and an upper intermetal dielectric layer 210 are sequentially stacked on the semiconductor substrate 100 having the bottom interconnection 130. A first photoresist pattern PR1 is formed on the upper intermetal dielectric layer 210. The first and second etch stopping layers 150 and 190 may be formed of silicon carbide (SiC) or silicon nitride ($Si_3N_4$). The bottom and upper intermetal dielectric layers 170 and 210 are formed from a material having a low dielectric constant. Preferably, the bottom and upper intermetal dielectric layers 170 and 210 are silicon oxycarbide (SiOC:H).

Figure 3B:
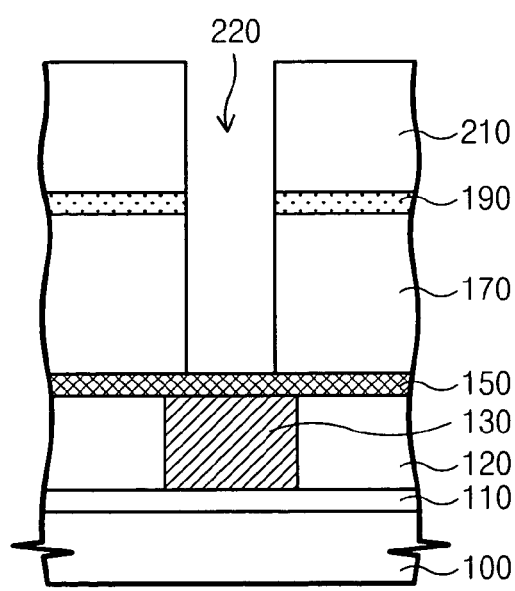

Referring to FIG. 3B, a first etch process is performed with a first etch recipe by using the first photoresist pattern PR1 as an etch mask, to sequentially pattern the upper intermetal dielectric layer 210, the second etch stopping layer 190, and the bottom intermetal dielectric layer 170. Thus, a first recessed region 220 is formed to expose a portion of the first etch stopping layer 150. The first recessed region 220 can be a contact hole or a via hole. Then, the first photoresist pattern PR1 is removed.

Figure 3C:
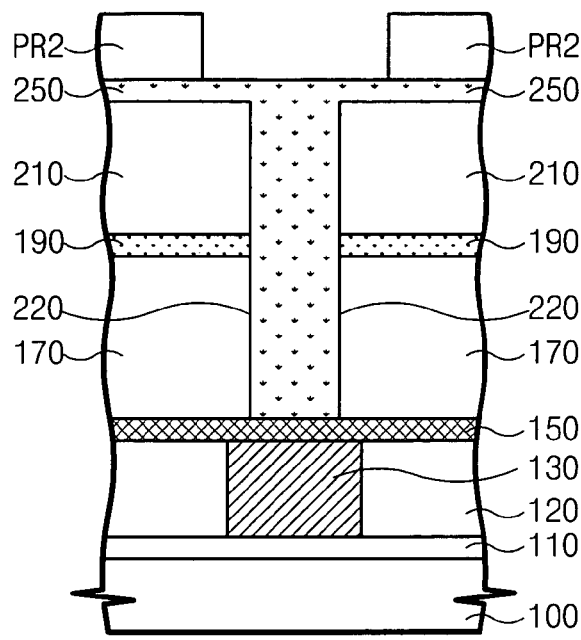

Referring to FIG. 3C, a bottom protecting layer 250 is formed filling the first recessed region 220 and covering an entire surface of the semiconductor substrate 100. The bottom-protecting layer 250 is made from a material of an oxide group. Preferably, the bottom-protecting layer 250 is a hydrogen silsesquioxane (HSQ). The bottom-protecting layer 250 is planarized by a CMP process so that the bottom-protecting layer 250 has a predetermined thickness on the upper intermetal dielectric layer 210. A second photoresist pattern PR2 is formed on the planarized bottom-protecting layer 250.

Figure 3D:
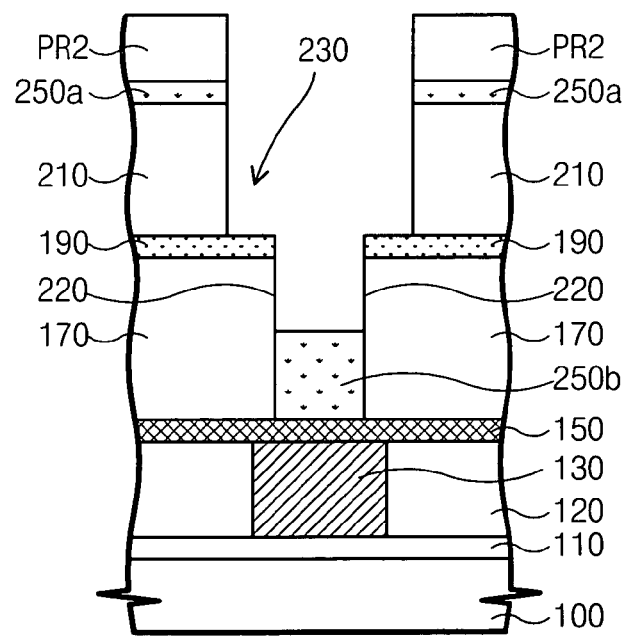

Referring to FIG. 3D, a second etch process is performed with a second etch recipe by using the second photoresist pattern PR2 as an etch mask to, simultaneously, pattern the bottom protecting layer 250 and the upper intermetal dielectric layer 210. The second etch process can be performed in an in-situ manner. The second etch process is stopped when the bottom protecting layer 250 is below the second etch stopping layer 190. The second etch stopping layer 190 protects the bottom intermetal dielectric layer 170. By the second etch process, a second recessed region 230 is formed exposing a portion of the second etch stopping layer 190, and the second recessed region 230 has a shallower depth and a wider width than the first recessed region 220. In addition, the second recessed region 230 has a groove form where an interconnection is formed. A first portion 250a of the bottom-protecting pattern remains under the second photoresist pattern PR2, and a second portion 250b bottom-protecting pattern remains at a bottom of the first recessed region 220.

In the second etch process, if the bottom protecting layer 250 has a faster etch rate than the upper intermetal dielectric layer 210, then the first etch stopping layer 150 will be patterned and cause damage to the bottom interconnection. If the bottom-protecting layer 250 has a slower etch rate than the upper intermetal dielectric layer 210, an oxide fence will be formed covering a sidewall of the bottom-protecting layer. Thus, to prevent these problems, an etch selectivity ratio of the upper intermetal dielectric layer 210 with respect to the bottom protecting layer 250 should preferably be about 0.5 to about 1.5. An etch selectivity ratio of the bottom protecting layer 250 with respect to the second etch stopping layer 190 should preferably be at least 10:1. For example, a mixed gas of a high-ratio fluorocarbon ($C_VF_W$) and a low-ratio fluorocarbon ($C_XF_Y$) can be used as an etching gas. In the chemical formula $C_VF_W$ of the high-ratio fluorocarbon, the V/W ratio is about 0.5 or greater. Preferably, the high-ratio fluorocarbon is a material selected from a group consisting of $C_4F_6$, $C_5F_8$, and $C_4F_8$. In the chemical formula $C_XF_Y$ of the low-ratio fluorocarbon, the X/Y ratio is about 0.4 or lower. Preferably, the low-ratio fluorocarbon is a material selected from a group consisting of $CF_4$ and $C_2F_6$. When the mixed gas of the high-ratio fluorocarbon ($C_VF_W$) and the low-ratio fluorocarbon ($C_XF_Y$) is used as the etching gas, a flow rate ratio of the high-ratio fluorocarbon ($C_VF_W$) with respect to the low-ratio fluorocarbon ($C_XF_Y$) is preferably about 0.5 to about 1.5. The second etch process may employ a mixed gas of the high-ratio fluorocarbon ($C_VF_W$) and a fluorohydrocarbon ($CH_TF_U$). Preferably, the fluorohydrocarbon is selected from a group consisting of $CH_3F$, $CH_2F_2$, and $CHF_3$. When the mixed gas of the high-ratio fluorocarbon ($C_VF_W$) and a fluorohydrocarbon ($CH_TF_U$) is used as the etch gas, a flow rate ratio of the fluorohydrocarbon ($CH_TF_U$) with respect to the high-ratio fluorocarbon ($C_VF_W$) is preferably about 0.5 to about 1.5.

Figure 3E:
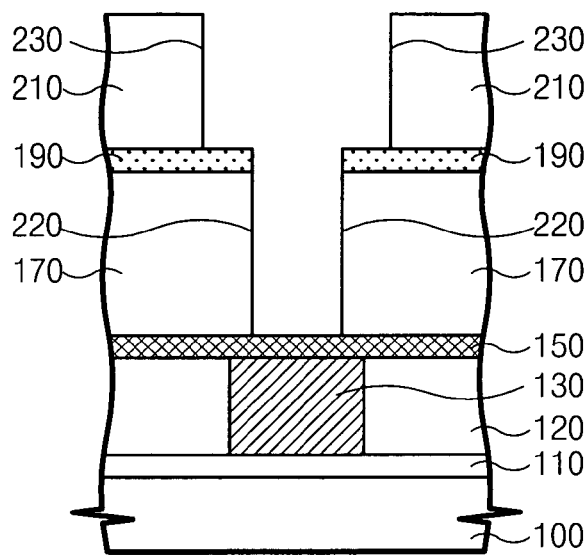

Referring to FIG. 3E, the second photoresist pattern PR2 is removed. The first and second portion, 250a and 250b, of the bottom protecting patterns may be removed by using a wet etch process employing a HF solution.

Figure 3F:
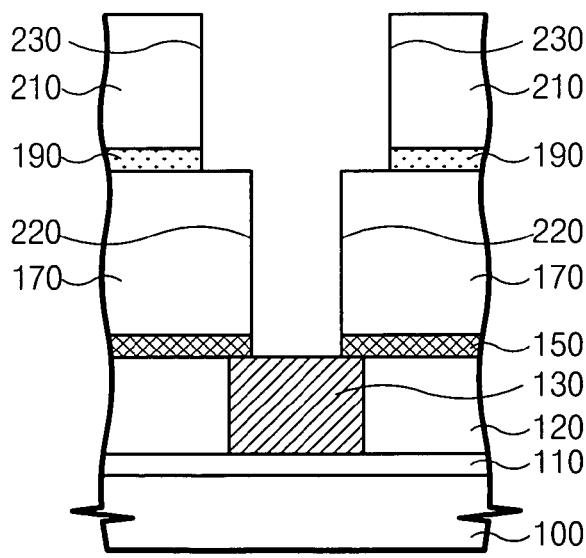

Referring to FIG. 3F, the exposed second etch stopping layer 190 is removed by using the upper intermetal dielectric layer 210 as an etch mask. Simultaneously, the first etch stopping layer 150 exposed under the first recessed region 220 is removed to form a dual damascene contact hole having the first recessed region 220 and the second recessed region 230 while exposing the bottom interconnection 130.

In a subsequent process, a barrier metal layer and a copper layer are sequentially stacked on an entire surface of the semiconductor substrate 100 where the dual damascene contact hole is formed, and planarized by a CMP process to form a copper interconnection of a dual damascene structure.

According to a dual damascene process of the present invention, a first recessed region through an intermetal dielectric layer is filled with a bottom protecting layer, and the bottom protecting layer and the intermetal dielectric layer are simultaneously etched to form a second recessed region that has a shallower depth and a wider width than the first recessed region on the first recessed region by using an etch gas that selectively etches the intermetal dielectric layer with respect to the bottom protecting layer. In other words, the etch gas has a etch selectivity ratio, the intermetal dielectric layer with respect to the bottom protecting layer, of about 0.5 to about 1.5. Thus, it is possible to form a dual damascene structure without the formation of a byproduct or an oxide fence.

What is claimed is:

1. A dual damascene process comprising:
forming a bottom layer on a semiconductor substrate;
forming an interlayer dielectric layer on the bottom layer;
patterning the interlayer dielectric layer to form a trench;
filling the trench with a conductive material to form the bottom interconnection;
sequentially forming a first etch stopping layer, a bottom intermetal dielectric layer, a second etch stopping layer and an upper intermetal dielectric layer on an entire surface of the semiconductor substrate having the bottom interconnection;
successively patterning the upper intermetal dielectric layer, the second etch stopping layer, and the bottom intermetal dielectric layer by using a first etch recipe to form a first recessed region exposing a predetermined region of the first etch stopping layer;
forming a bottom-protecting layer having a planarized surface on the upper intermetal dielectric layer and in the first recessed region;
successively patterning the bottom protecting layer and the upper intermetal dielectric layer by using a second etch recipe to form a second recessed region being overlapped with the first recessed region and having a wider width than the first recessed region;
selectively removing the bottom protecting layer to expose the predetermined region of the first etch stopping layer; and
removing the first etch stopping layer exposed by at least the first recessed region to expose the bottom interconnection,
wherein the second etch recipe uses an etch gas that makes an etch selectivity of the upper intermetal dielectric layer with respect to the bottom protecting layer to be about 0.5 to about 1.5.

2. The dual damascene process as claimed in claim 1, wherein the upper and bottom intermetal dielectric layers comprises silicon oxycarbide (SiOC:H).

3. The dual damascene process as claimed in claim 1, wherein the bottom-protecting layer comprises hydrogen silsesquioxane.

4. The dual damascene process as claimed in claim 1, wherein the bottom layer and the interlayer dielectric layer are a silicon oxide.

5. The dual damascene process as claimed in claim 1, wherein the conductive material is copper, aluminum, or tungsten.

6. The dual damascene process as claimed in claim 1, wherein the second etch gas comprises a mixture of a high-ratio fluorocarbon ($C_V F_W$) and a low-ratio fluorocarbon ($C_X F_Y$).

7. The dual damascene process as claimed in claim 6, wherein a flow rate ratio of the high-ratio fluorocarbon with respect to the low-ratio fluorocarbon is about 0.5 to about 1.5.

8. The dual damascene process as claimed in claim 6, wherein V/W is about 0.5 or greater in the chemical formula $C_V F_W$ of the high-ratio fluorocarbon.

9. The dual damascene process as claimed in claim 8, wherein the high-ratio fluorocarbon is $C_4 F_6$, $C_5 F_8$, or $C_4 F_8$.

10. The dual damascene process as claimed in claim 6, wherein X/Y is about 0.4 or lower in the chemical formula $C_X F_Y$ of the low-ratio fluorocarbon.

11. The dual damascene process as claimed in claim 10, wherein the low-ratio fluorocarbon is $CF_4$ or $C_2 F_6$.

12. The dual damascene process as claimed in claim 1, wherein the second etch gas comprises a mixture of a high-ratio fluorocarbon ($C_V F_W$) and a fluorohydrocarbon ($CH_T F_U$) as an etch gas.

13. The dual damascene process as claimed in claim 12, wherein the fluorohydrocarbon is $CH_3 F$, $CH_2 F_2$, or $CHF_3$.

14. The dual damascene process as claimed in claim 12, wherein a flow rate ratio of the fluorohydrocarbon with respect to the high-ratio fluorocarbon is about 0.5 to about 1.5.

15. The dual damascene process as claimed in claim 12, wherein V/W is about 0.5 or greater in the chemical formula $C_V F_W$ of the high-ratio fluorocarbon.

16. The dual damascene process as claimed in claim 15, wherein the high-ratio fluorocarbon is $C_4 F_6$, $C_5 F_8$, or $C_4 F_8$.

* * * * *